(12) United States Patent
Irieda et al.

(10) Patent No.: US 10,291,206 B2
(45) Date of Patent: May 14, 2019

(54) ACOUSTIC WAVE DEVICE

(71) Applicant: TAIYO YUDEN CO., LTD., Tokyo (JP)

(72) Inventors: Taisei Irieda, Tokyo (JP); Yoshio Satoh, Tokyo (JP); Tokihiro Nishihara, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/497,606

(22) Filed: Apr. 26, 2017

(65) Prior Publication Data

US 2017/0359050 A1    Dec. 14, 2017

(30) Foreign Application Priority Data

Jun. 10, 2016    (JP) .................. 2016-116558

(51) Int. Cl.
| | | |
|---|---|---|
| *H03H 9/70* | (2006.01) | |
| *H01L 41/08* | (2006.01) | |
| *H03H 9/205* | (2006.01) | |
| *H03H 9/25* | (2006.01) | |
| *H03H 9/54* | (2006.01) | |
| *H03H 9/64* | (2006.01) | |

(Continued)

(52) U.S. Cl.
CPC ........... *H03H 9/70* (2013.01); *H01L 41/0805* (2013.01); *H03H 9/02228* (2013.01); *H03H 9/173* (2013.01); *H03H 9/205* (2013.01); *H03H 9/25* (2013.01); *H03H 9/542* (2013.01); *H03H 9/64* (2013.01); *H03H 9/725* (2013.01); *H03H 9/0014* (2013.01); *H03H 9/131* (2013.01); *H03H 9/706* (2013.01)

(58) Field of Classification Search
CPC .... H03H 9/205; H03H 9/02228; H03H 9/173; H03H 9/25; H03H 9/542; H03H 9/64; H03H 9/725; H03H 9/0014; H03H 9/131; H03H 9/706; H01L 41/0805
USPC ............................................... 333/133
See application file for complete search history.

(56) References Cited

U.S. PATENT DOCUMENTS 3,511,958 A * 5/1970 Staats ................. H01P 1/16
                                                                 219/746
2006/0290446 A1    12/2006 Aigner et al.
(Continued)

FOREIGN PATENT DOCUMENTS

| JP | 2007-006495 A | 1/2007 |
|---|---|---|
| JP | 2008-085989 A | 4/2008 |
| WO | 2015/045794 A1 | 4/2015 |

OTHER PUBLICATIONS

Japanese Office Action dated Jan. 8, 2019, in a counterpart Japanese patent application No. 2016-116558. (A machine translation (not reviewed for accuracy) attached.).

*Primary Examiner* — Benny T Lee
*Assistant Examiner* — Hafizur Rahman
(74) *Attorney, Agent, or Firm* — Chen Yoshimura LLP

(57) ABSTRACT

An acoustic wave device includes: a piezoelectric thin film resonator that is connected between a first node and a second node; and a resonant circuit that is connected in parallel with the piezoelectric thin film resonator between the first node and the second node, and has a resonant frequency f0 that meets a condition of $2 \times fa \times 0.92 \leq f0$ where fa represents an antiresonant frequency of the piezoelectric thin film resonator.

10 Claims, 19 Drawing Sheets

(51) Int. Cl.
    *H03H 9/72*     (2006.01)
    *H03H 9/02*     (2006.01)
    *H03H 9/17*     (2006.01)
    H03H 9/00     (2006.01)
    H03H 9/13     (2006.01)

(56) References Cited

U.S. PATENT DOCUMENTS

| | | |
|---|---|---|
| 2008/0055021 A1 | 3/2008 | Ueda et al. |
| 2010/0110940 A1* | 5/2010 | Hara .................... H03H 9/0571 370/277 |
| 2016/0204755 A1 | 7/2016 | Kando et al. |

\* cited by examiner

FIG. 13A Related Art
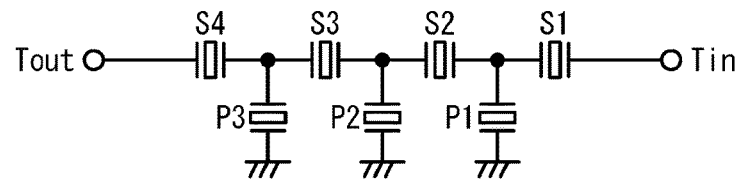
FIG. 13B Related Art
|  | S1 | S2 | S3 | S4 | P1 | P2 | P3 |
|---|---|---|---|---|---|---|---|
| CAPACITANCE [pF] | 1.392 | 0.748 | 0.748 | 1.508 | 2.603 | 0.869 | 2.093 |
| RESONANT FREQUENCY [GHz] | 2.533 | 2.549 | 2.543 | 2.545 | 2.460 | 2.479 | 2.460 |
FIG. 13C Related Art
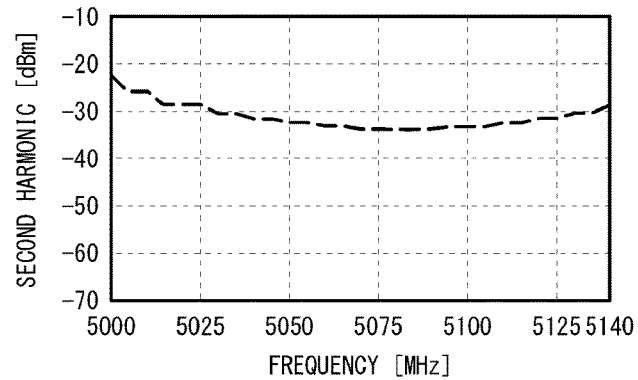

ACOUSTIC WAVE DEVICE

CROSS-REFERENCE TO RELATED APPLICATION

This application is based upon and claims the benefit of priority of the prior Japanese Patent Application No. 2016-116558, filed on Jun. 10, 2016, the entire contents of which are incorporated herein by reference.

FIELD

A certain aspect of the present invention relates to an acoustic wave device.

BACKGROUND

Acoustic wave devices using piezoelectric thin film resonators have been used as filters and multiplexers of wireless devices such as, for example, mobile phones. The piezoelectric thin film resonator has a structure designed to have a piezoelectric film sandwiched between a pair of electrodes. Film Bulk Acoustic Resonators (FBARs) and Solidly Mounted Resonator (SMRs) have been known as the piezoelectric thin film resonator.

When a large electric power is input to the piezoelectric thin film resonator, non-linearity depending on the c-axis direction of the piezoelectric film causes a second harmonic to be generated in an output signal. Thus, there has been known a technique that divides the piezoelectric thin film resonator so that the second harmonic is reduced as disclosed in, for example, Japanese Patent Application Publication Nos. 2008-085989 and 2007-006495 hereinafter referred to as Patent Documents 1 and 2, respectively.

When a resonator is divided so that the second harmonic is reduced as described in, for example, Patent Documents 1 and 2, the number of resonators increases, and the chip size thus increases. In addition, the reduction of the second harmonic may become insufficient because of the parasitic capacitance component of the wiring line connecting divided resonators.

SUMMARY OF THE INVENTION

According to an aspect of the present invention, there is provided an acoustic wave device including: a piezoelectric thin film resonator that is connected between a first node and a second node; and a resonant circuit that is connected in parallel with the piezoelectric thin film resonator between the first node and the second node, and has a resonant frequency f0 that meets a condition of $2 \times fa \times 0.92 \leq f0$ where fa represents an antiresonant frequency of the piezoelectric thin film resonator.

BRIEF DESCRIPTION OF THE DRAWINGS

FIG. 13A is a circuit diagram of a filter in accordance with a third comparative example; FIG. 13B presents the conditions of each resonator used for a simulation of the third comparative example; and FIG. 13C is a graph of a second harmonic versus frequency in the third comparative example;

DETAILED DESCRIPTION

Figure 1:
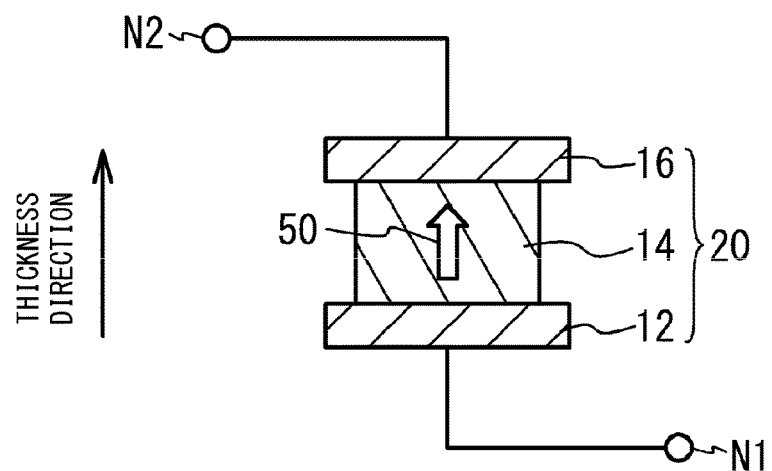
FIG. 1 is a schematic cross-sectional view of a piezoelectric thin film resonator used in comparative examples and embodiments.

A description will first be given of comparative examples. First Comparative Example FIG. 1 is a schematic cross-sectional view of a piezoelectric thin film resonator used in comparative examples and embodiments. As illustrated in FIG. 1, a piezoelectric thin film resonator 20 includes a piezoelectric film 14, a lower electrode 12, and an upper electrode 16. The lower electrode 12 and the upper electrode 16 are located so as to sandwich the piezoelectric film 14. The lower electrode 12 is coupled to a node N1, and the upper electrode 16 is coupled to a node N2. The piezoelectric film 14 is made of, for example, aluminum nitride (AlN) or zinc oxide (ZnO). The lower electrode 12 and the upper electrode 16 are formed of, for example, a composite film of a ruthenium (Ru) film, which is located closer to the piezoelectric film 14, and a chrome (Cr) film, which is located closer to the outside. The lower electrode 12 and the upper electrode 16 may be formed of a single-layer film of aluminum (Al), titanium (Ti), copper (Cu), molybdenum (Mo), tungsten (W), tantalum (Ta), platinum (Pt), rhodium (Rh), or iridium (Jr), or a composite film of at least two of them instead of a Ru film and a Cr film.

In the piezoelectric thin film resonator 20, one-half of the wavelength λ, of the resonant frequency corresponds to the thickness of the piezoelectric film 14. The wavelength of the second harmonic substantially corresponds to the thickness of the piezoelectric film 14. If the piezoelectric film 14 is diphycercal, the upper electrode 16 and the lower electrode 12 have the same electric potential. Thus, a second harmonic is not generated. However, when the piezoelectric film 14 is made of, for example, aluminum nitride (A1N) or zinc oxide (ZnO), the piezoelectric film 14 is oriented in the c-axis to obtain good characteristics. Thus, a c-axis direction 50 becomes a thickness direction. At this time, the symmetry of the c-axis direction is violated in the piezoelectric film 14, and the distribution of the electric field becomes uneven. Thus, the difference in potential is generated between the upper electrode 16 and the lower electrode 12. The generation of the difference in potential generates a second harmonic. The c-axis direction 50 may be, more generally, a polarization direction.

Figure 2A:
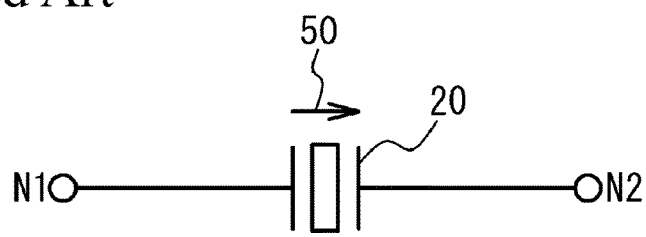
FIG. 2A is a circuit diagram of an acoustic wave device in accordance with a first comparative example.
Figure 2B:
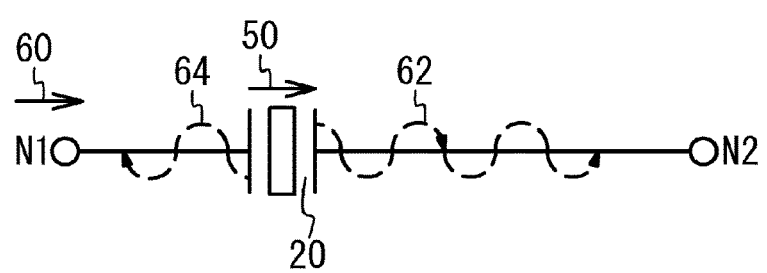
FIG. 2B illustrates a second harmonic generated in the first comparative example.

FIG. 2A is a circuit diagram of an acoustic wave device in accordance with a first comparative example, and FIG. 2B illustrates a second harmonic generated in the first comparative example. As illustrated in FIG. 2A, the piezoelectric thin film resonator 20 is connected between the nodes N1 and N2. The c-axis direction 50 is a direction from the node N1 to the node N2.

As illustrated in FIG. 2B, a high-frequency signal composed of a fundamental wave 60 is input from the node N1. In the piezoelectric thin film resonator 20, second harmonics 62 and 64 are generated from the fundamental wave 60, and are respectively emitted in the direction to the node N1 and the direction to the node N2. Accordingly, the second harmonic 62 is output from the node N2. The second harmonics 62 and 64 have frequencies approximately twice the frequency of the fundamental wave 60. The second harmonics 62 and 64 are opposite in phase to each other.

Figure 3A:
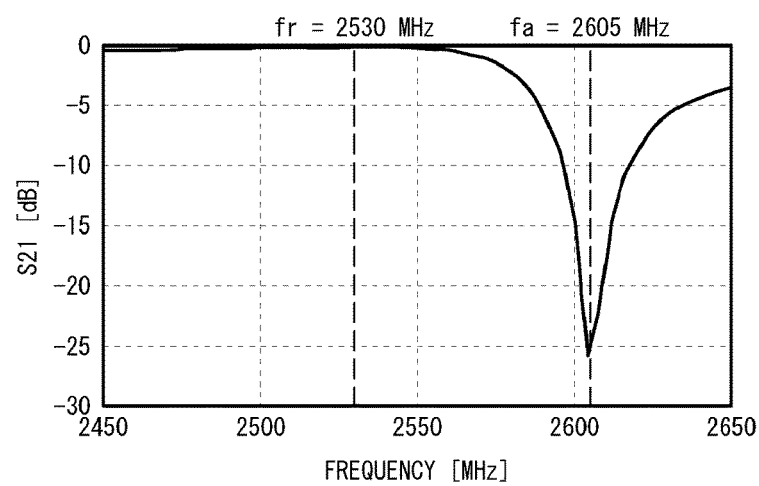
FIG. 3A illustrates a pass characteristic (S21) in the first comparative example.
Figure 3B:
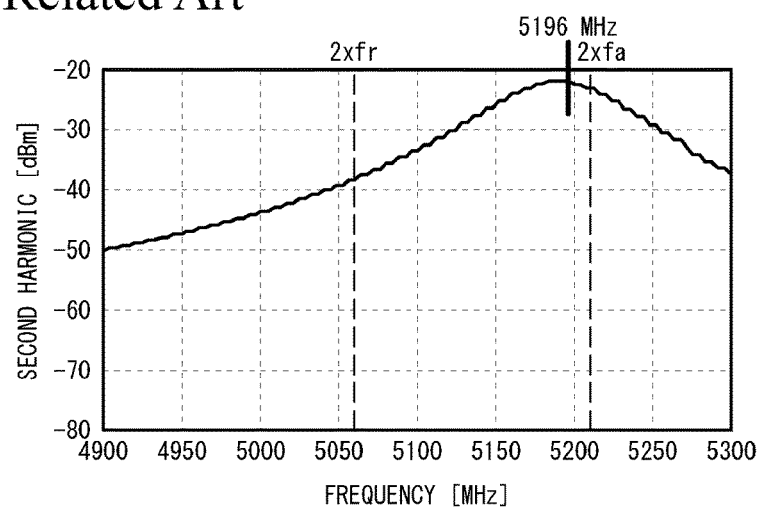
FIG. 3B illustrates a second harmonic.

In the first comparative example, the second harmonic was simulated. Calculated was the magnitudes of the second harmonics 62 and 64 emitted from the piezoelectric thin film resonator 20 when a signal composed of the fundamental wave 60 was input to the node N1. The second harmonic can be calculated based on a non-linear current that is proportional to "the square of the electric field intensity" applied to the piezoelectric film 14, "the product of the electric field intensity and the distortion", and "the square of the distortion". The simulation conditions are as follows.
Piezoelectric film 14: C-axis oriented aluminum nitride (AlN)
Passband: 2500 MHz to 2570 MHz (corresponds to band 7)
Band twice the passband: 5000 MHz to 5140 MHz
Power of the fundamental wave input to the node N1: 28 dBm
Assumed as the passband is the transmit band of band 7.
The conditions of the piezoelectric thin film resonator 20 are as follows.
Resonant frequency fr: 2530 MHz
Electromechanical coupling coefficient $k^2$: 6.929%
Electrostatic capacitance C0: 1.5 pF FIG. 3A illustrates a pass characteristic (S21) in the first comparative example, and FIG. 3B illustrates the second harmonic. As illustrated in FIG. 3A, the resonant frequency fr is 2530 MHz, and the antiresonant frequency fa is 2605 MHz. As illustrated in FIG. 3B, the second harmonic has a broad single peak characteristic. The peak of the second harmonic is 5196 MHz, and is located between a frequency of 2×fr, which is twice the resonant frequency fr, and the frequency of 2×fa, which is twice the antiresonant frequency fa. The peak of the second harmonic is approximately −20 dBm.

Second Comparative Example

Figure 4:
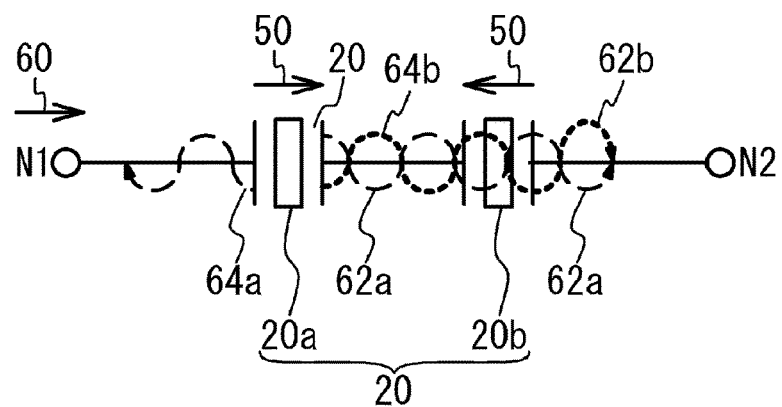
FIG. 4 is a circuit diagram of an acoustic wave device in accordance with a second comparative example.

FIG. 4 is a circuit diagram of an acoustic wave device in accordance with a second comparative example. As illustrated in FIG. 4, the piezoelectric thin film resonator 20 is divided into resonators 20a and 20b. The c-axis direction 50 of the resonator 20a is opposite to the c-axis direction 50 of the resonator 20b. That is, the c-axis direction 50 of the resonator 20a viewed from the node N2 (or N1) is opposite to the c-axis direction 50 of the resonator 20b viewed from the node N2 (or N1). The above-described division will be called reverse series division. When the fundamental wave 60 is input from the node N1, second harmonics 62a and 64a are respectively emitted from the resonator 20a in the directions to the nodes N2 and N1. Second harmonics 62b and 64b are respectively emitted from the resonator 20b in the directions to the nodes N2 and N1. The c-axis direction 50 of the resonator 20b is opposite to that of the resonator 20a. Thus, the second harmonics 62a and 62b are opposite in phase to each other. Accordingly, the second harmonics 62a and 62b cancel out each other, and therefore, the second harmonic output from the node N2 is reduced.

In the second comparative example, since the resonators 20a and 20b are provided, the chip size increases. To reduce the second harmonic, the second harmonics 62a and 62b preferably have the opposite phase and the same amplitude. However, the parasitic capacitance component of the wiring line between the resonators 20a and 20b causes the second harmonics 62a and 62b to have phases different from the opposite phase and/or different amplitudes. This prevents the sufficient reduction of the second harmonic.

Hereinafter, a description will be given of embodiments that reduce a second harmonic by a method other than the method that divides a piezoelectric thin film resonator.

First Embodiment

Figure 5A:
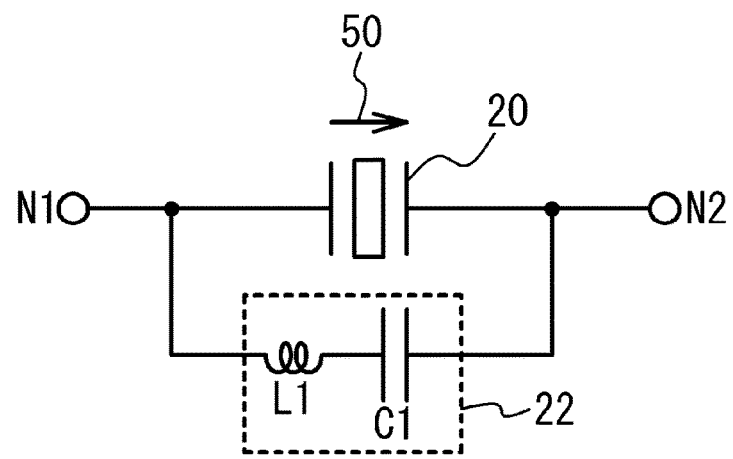
FIG. 5A is a circuit diagram of an acoustic wave device in accordance with a first embodiment.
Figure 5B:
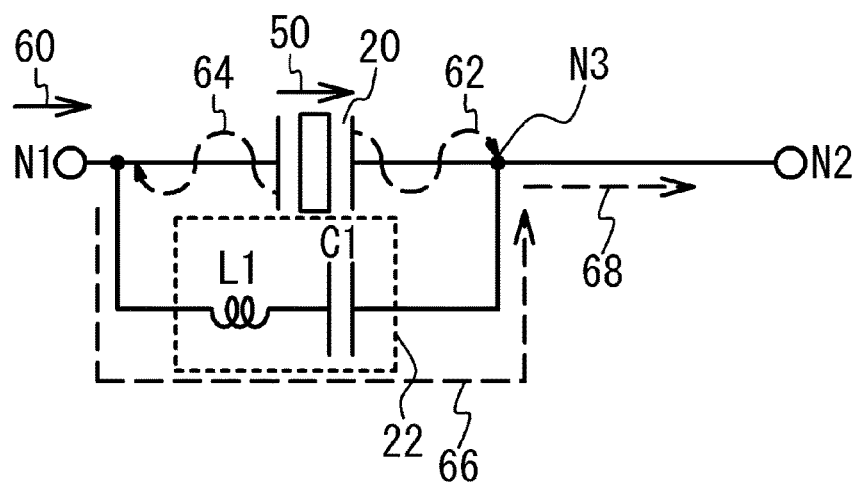
FIG. 5B illustrates a second harmonic generated in the first embodiment.

FIG. 5A is a circuit diagram of an acoustic wave device in accordance with a first embodiment, and FIG. 5B illustrates a second harmonic generated in the first embodiment. As illustrated in FIG. 5A, a resonant circuit 22 is connected in parallel with the piezoelectric thin film resonator 20 between the nodes N1 and N2. The resonant circuit 22 includes an inductor L1 and a capacitor C1 connected in series between the nodes N1 and N2. As illustrated in FIG. 5B, the second harmonic 64 emitted from the piezoelectric thin film resonator 20 in the direction to the node N1 propagates to the node N2 through the resonant circuit 22 as a second harmonic 66. Since the second harmonics 62 and 66 have the opposite phase and the same amplitude, the second harmonics 62 and 66 cancel out each other at a node N3. Thus, a second harmonic 68 output from the node N2 can be reduced. It is preferable that the resonant circuit 22 allows the second harmonic 66 to pass therethrough and does not allow signals with other frequencies to pass therethrough. Thus, the resonant frequency of the resonant circuit 22 is made to be the frequency of the second harmonic 66.

In the first embodiment, the second harmonic was simulated. Calculated was the magnitude of the second harmonic 68 output from the node N2 when a signal composed of the fundamental wave 60 was input to the node N1.

The conditions of the resonant circuit 22 are as follows.
Resonant frequency f0: 5196 MHz
Capacitance of C1: 0.5 pF
Inductance of L1: 1.876 nH
Q-value of L1: 15
The inductance of L1 was calculated by the following equation so that the resonant frequency f0 became 5196 MHz, which is the peak frequency of the second harmonic in the first comparative example in FIG. 3B.

$$L1=(1/f0^2)\times(1/((2\pi)^2\times C1)) \qquad (1)$$

Other simulation conditions are the same as those of the first comparative example.

Figure 6:
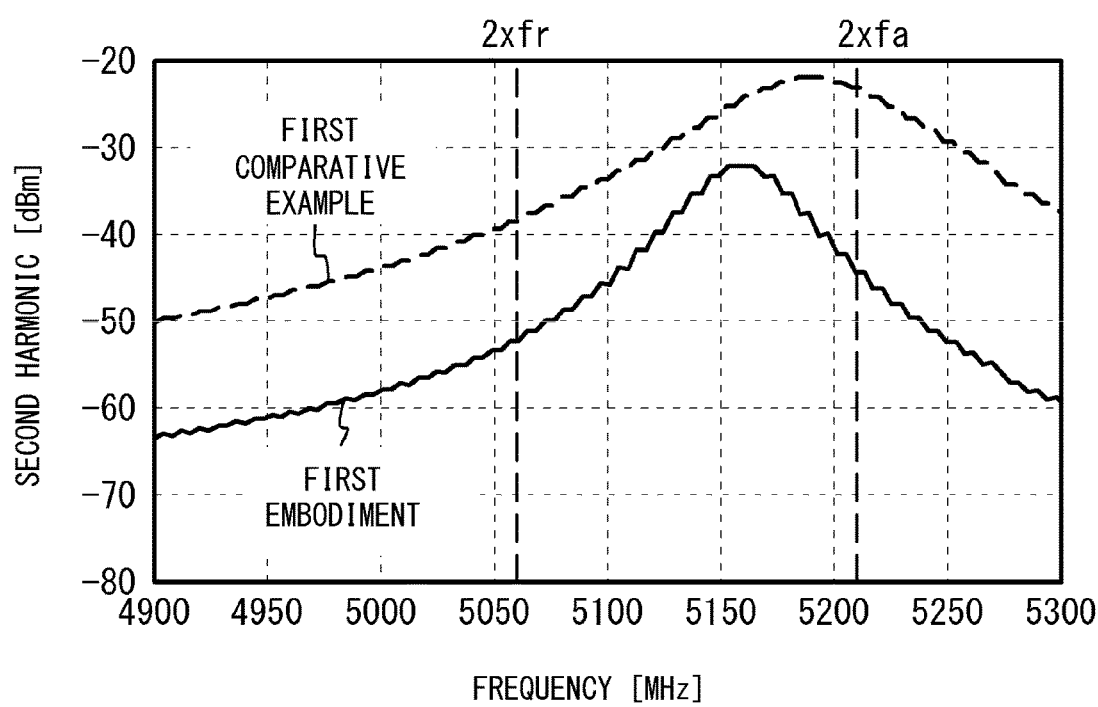
FIG. 6 is a graph of a second harmonic versus frequency in the first embodiment and the first comparative example.

FIG. 6 is a graph of the second harmonic versus frequency in the first embodiment and the first comparative example. As illustrated in FIG. 6, across the entire frequency region, the second harmonic is reduced. The peak value of the second harmonic of the first embodiment is approximately −30 dBm, and is less than that of the first comparative example by 10 dBm.

Next, the resonant frequency f0 of the resonant circuit 22 was varied to simulate the reduced amount of the peak value of a second harmonic. The reduced amount of the peak value of the second harmonic is a value calculated by subtracting the peak value of the second harmonic of the first embodiment from the peak value of the second harmonic of the first comparative example. In FIG. 6, the reduced amount of the peak value of the second harmonic is approximately −10 dBm. The simulation conditions are as follows.
Piezoelectric thin film resonator 20
    Resonant frequency fr: 2535 MHz
    Antiresonant frequency fa: 2610 MHz
    Electromechanical coupling coefficient $k^2$: 6.929%
    Electrostatic capacitance C0: 1.5 pF
Resonant circuit 22
    Capacitance of C1: 0.5 pF
    Q-value of L1: 15
    Inductance of L1: Calculated from the equation 1 so that the desired resonant frequency f0 is achieved.
Other simulation conditions are the same as those of the first comparative example.

Figure 7A:
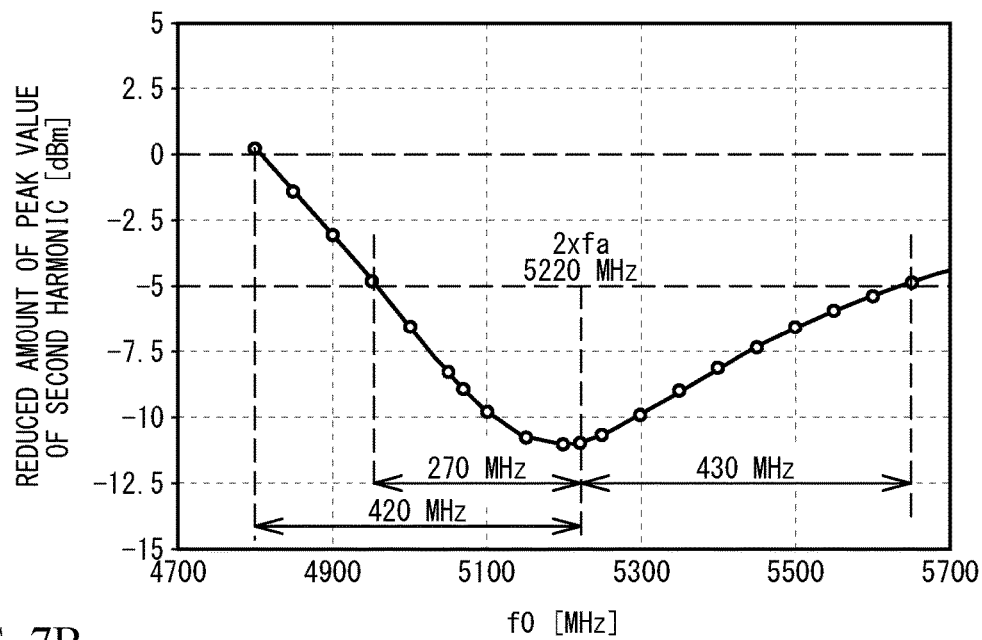
FIG. 7A is a graph of the reduced amount of the peak value of a second harmonic versus resonant frequency f0 of a resonant circuit shown in FIG. 5A.

FIG. 7A is a graph of the reduced amount of the peak value of a second harmonic versus the resonant frequency f0 of the resonant circuit. As illustrated in FIG. 7A, the peak value of the second harmonic is improved the most when the resonant frequency f0 of the resonant circuit 22 is 5220 MHz, which is twice the antiresonant frequency of the piezoelectric thin film resonator 20, i.e., 2×fa. When the resonant frequency f0 becomes greater than 2×fa, the reduced amount slowly decreases. When the resonant frequency becomes less than 2×fa, the reduced amount rapidly decreases. When the resonant frequency f0 is made to be less than 2×fa by approximately 420 MHz, the reduced amount of the peak value of the second harmonic becomes 0 dBm. When the resonant frequency f0 is in the range of 2×fa−270 MHz≤f0≤2×fa+430 MHz, the reduced amount of the peak value of the second harmonic becomes less than −5 dBm.

The resonant frequency fr and the antiresonant frequency fa of the piezoelectric thin film resonator 20 were varied, and the simulation was conducted. The simulation conditions are as follows.
Resonator A: fr=2535 MHz, fa=2610 MHz
Resonator B: fr=2500 MHz, fa=2574 MHz
Resonator C: fr=2570 MHz, fa=2647 MHz
Here, the resonant frequency fr and the antiresonant frequency fa are respectively the resonant frequency and the antiresonant frequency of the piezoelectric thin film resonator 20 alone to which the resonant circuit 22 is not coupled. The resonator A corresponds to the piezoelectric thin film resonator 20 same as that of FIG. 6. Other simulation conditions are the same as those of FIG. 7A, and the description thereof is thus omitted.

Figure 7B:
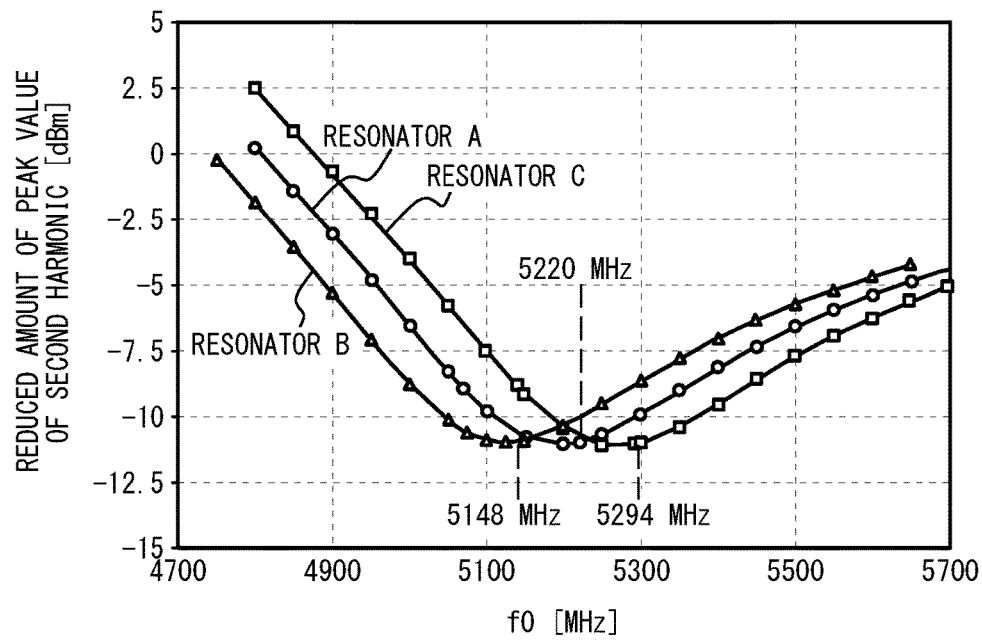
FIG. 7B is a graph of the reduced amount of the peak value of a second harmonic versus resonant frequency f0 in a resonator with 2535 MHz of a resonant frequency and 2610 MHz of an antiresonant frequency, a resonator with 2500 MHz of a resonant frequency and 2574 MHz of an antiresonant frequency and a resonator with 2570 MHz of a resonant frequency and 2647 MHz of an antiresonant frequency.

FIG. 7B is a graph of the reduced amount of the peak value of the second harmonic versus the resonant frequency f0 in the resonators A through C. As illustrated in FIG. 7B, the bottoms of the reduced amounts of the resonators A, B, and C are respectively 5220 MHz, 5148 MHz, and 5294 MHz. These values correspond to 2×fa of the resonators A through C. The curve of the reduced amount with respect to the resonant frequency f0 shifts depending on 2×fa. As described above, even though the resonant frequency fr of the piezoelectric thin film resonator 20 changes, the relation between the resonant frequency f0 and the reduced amount remains unchanged.

When expressed by the ratio of the antiresonant frequency fa, the results of FIG. 7A are within the typical range of the resonant frequency f0. To make the reduced amount 0 dBm or less, it is sufficient if the equation 2 is met based on (5220−420)/5220=0.92.

$$2\times fa\times 0.92\leq f0 \qquad (2)$$

To make the reduced amount −5 dBm or less, it is sufficient if the equation 3 is met based on (5220−270)/5220=0.95 and (5220+430)/5220=1.08.

$$2\times fa\times 0.95\leq f0\leq 2\times fa\times 1.08 \qquad (3)$$

In the first embodiment, the resonant frequency f0 of the resonant circuit 22 is made to be 2×fa×0.92≤f0. This configuration allows the signal of the second harmonic 66 that is opposite in phase to the second harmonic 62 to be transmitted from the node N1 to the node N3 as illustrated in FIG. 5B. Thus, at the node N3, the second harmonics 62 and 66 cancel out each other, and the second harmonic output from the node N2 can be reduced. Therefore, unlike the second comparative example, the second harmonic can be reduced without dividing the piezoelectric thin film resonator 20. To reduce the second harmonic, the resonant frequency f0 preferably meets the condition of 2×fa× 0.93≤f0, more preferably meets the condition of 2×fa× 0.95≤f0, further preferably meets the condition of 2×fa× 0.97≤f0. In addition, the resonant frequency f0 preferably meets the condition of f0≤2×fa×1.15, meets the condition of f0≤2×fa×1.08, further preferably meets the condition of f0≤2×fa×1.05.

As the resonant circuit 22, a resonant circuit having a structure other than the one illustrated in FIG. 5A can be used. However, a structure in which the capacitor C1 and the inductor L1 are connected in series between the nodes N1 and N2 is preferable. This structure can make the pass characteristic of the resonant circuit 22 of the second harmonic 66 good.

Second Embodiment

Figure 8A:
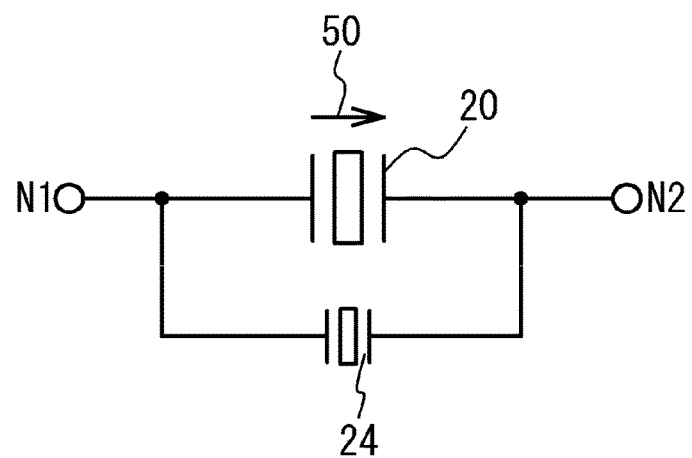
FIG. 8A is a circuit diagram of an acoustic wave device in accordance with a second embodiment.
Figure 8B:
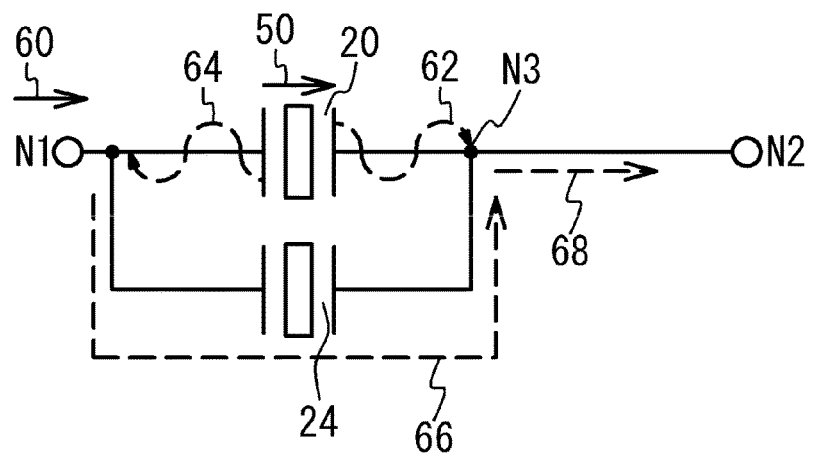
FIG. 8B illustrates a second harmonic generated in the second embodiment.

FIG. 8A is a circuit diagram of an acoustic wave device in accordance with a second embodiment, and FIG. 8B illustrates a second harmonic generated in the second embodiment. As illustrated in FIG. 8A, the acoustic wave resonator 24 is connected in parallel with the piezoelectric thin film resonator 20 between the nodes N1 and N2. As illustrated in FIG. 8B, the second harmonic 64 emitted from the piezoelectric thin film resonator 20 in the direction to the node N1 propagates as the second harmonic 66 to the node N2 through the acoustic wave resonator 24. At the node N3, the second harmonics 62 and 66 cancel out each other. Accordingly, the second harmonic 68 output from the node N2 can be reduced.

In the second embodiment, the magnitude of the second harmonic 68 was simulated. The conditions of the acoustic wave resonator 24 are as follows.
Type of the resonator: Piezoelectric thin film resonator
Resonant frequency f0r: 5205 MHz
Electrostatic capacitance C00: 0.5 pF
Other conditions of the acoustic wave resonator 24 are the same as those of the piezoelectric thin film resonator 20. Other simulation conditions are the same as those of the simulation of FIG. 6 in the first embodiment.

Figure 9:
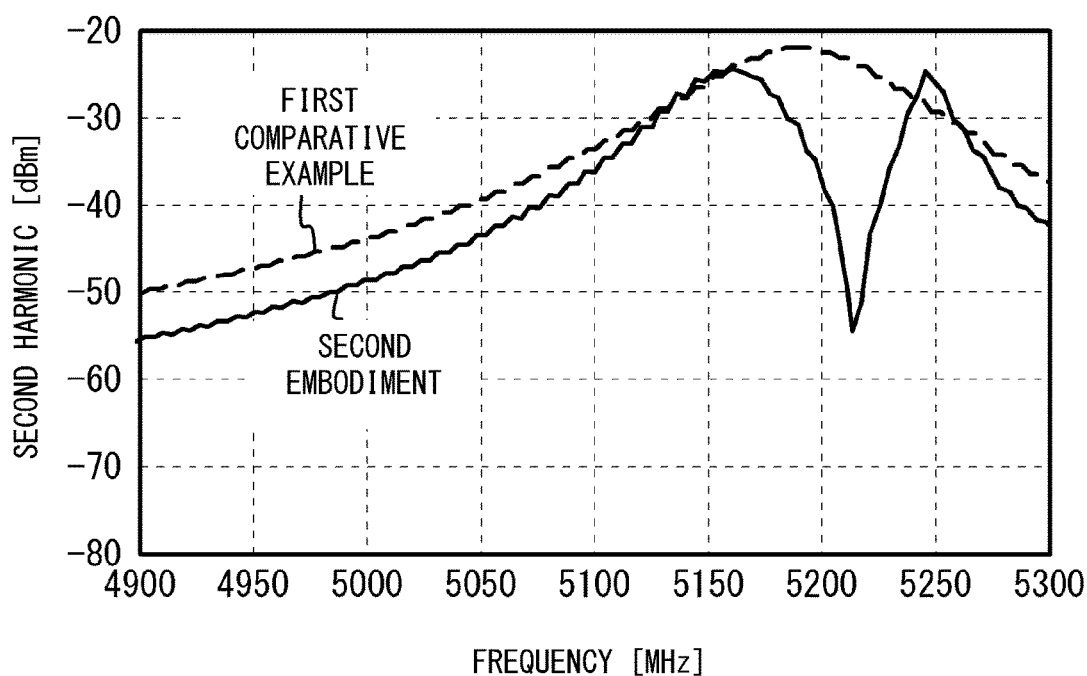
FIG. 9 is a graph of a second harmonic versus frequency in the second embodiment and the first comparative example.

FIG. 9 is a graph of the second harmonic versus frequency in the second embodiment and the first comparative example. As illustrated in FIG. 9, in the second embodiment, the second harmonic can be made to be especially small at around the peak of the second harmonic of the first comparative example. In addition, across the entire frequency region, the second harmonic can be made to be small. As described above, the second harmonic can be reduced by making the resonant frequency f0r of the acoustic wave resonator 24 approximately equal to the peak frequency of the second harmonic.

The resonant frequency f0r of the acoustic wave resonator 24 is preferably within the range same as that of the first embodiment. For example, the resonant frequency f0r preferably meets the condition of $2 \times fa \times 0.92 \leq f0r$, more preferably meets the condition of $2 \times fa \times 0.95 \leq f0r \leq 2 \times fa \times 1.08$.

Figure 10A:
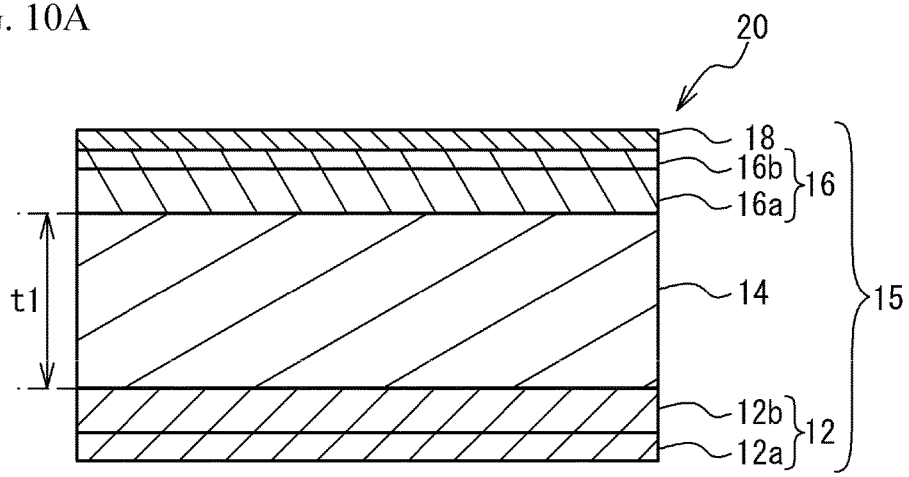
FIG. 10A and FIG. 10B are cross-sectional views of multilayered films of a piezoelectric thin film resonator and an acoustic wave resonator shown in FIG. 8A, respectively.
Figure 10B:
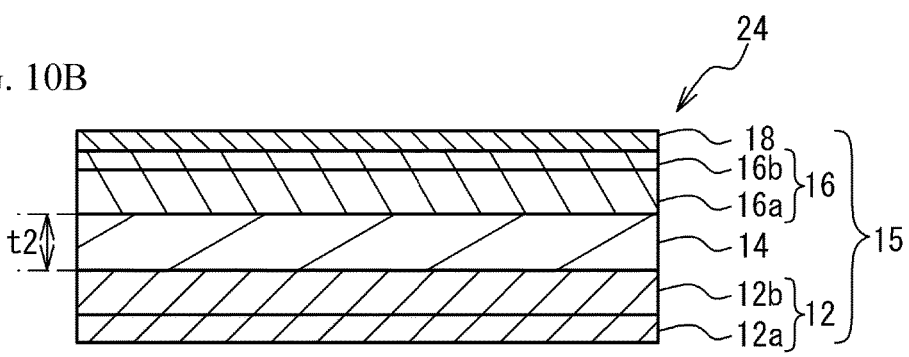

FIG. 10A and FIG. 10B are cross-sectional views of multilayered films of the piezoelectric thin film resonator 20 and the acoustic wave resonator 24, respectively. As illustrated in FIG. 10A and FIG. 10B, multilayered films 15 of the piezoelectric thin film resonator 20 and the acoustic wave resonator 24 include the lower electrode 12, the piezoelectric film 14, the upper electrode 16, and an insulating film 18. The lower electrode 12 includes a lower layer 12a and an upper layer 12b. The upper electrode 16 includes a lower layer 16a and an upper layer 16b. The resonant frequency and the antiresonant frequency of each of the piezoelectric thin film resonator 20 and the acoustic wave resonator 24 can be adjusted by the configuration of the corresponding multilayered film 15.

Figure 10C:
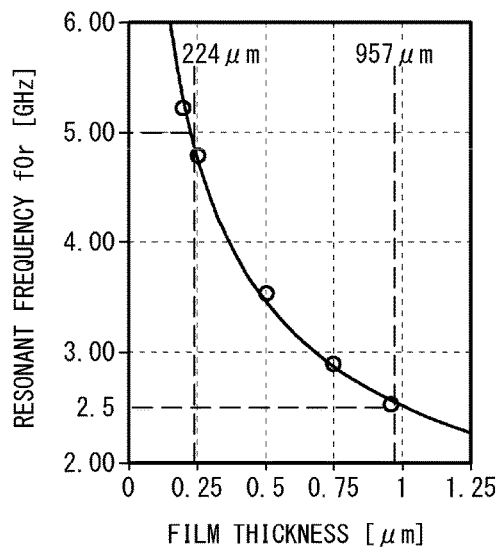
FIG. 10C is a graph of resonant frequency versus the film thickness of a piezoelectric film.

The film thicknesses of the piezoelectric films 14 of the piezoelectric thin film resonator 20 and the acoustic wave resonator 24 were set to t1 and t2, respectively, and other configurations were made to be the same to calculate the resonant frequency. The material and the film thickness of each layer are as follows.
Insulating film 18: Silicon oxide film 38 nm
Upper layer 16b: Chrome film 23 nm
Lower layer 16a: Ruthenium film 183 nm
Piezoelectric film 14: Aluminum nitride film
Upper layer 12b: Ruthenium film 152 nm
Lower layer 12a: Chrome film 76 nm FIG. 10C is a graph of resonant frequency versus the film thickness of the piezoelectric film. Circles represent measurement points, and the solid line is an approximate curve. As illustrated in FIG. 10C, as the film thickness of the piezoelectric film 14 decreases, the resonant frequency increases. The film thicknesses of the piezoelectric film 14 when the resonant frequency becomes 2.5 GHz and 5.0 GHz are 957 nm and 224 nm, respectively. Thus, the film thicknesses t1 and t2 are set to 957 nm and 224 nm, respectively. This configuration can form the piezoelectric thin film resonator 20 and the acoustic wave resonator 24.

Figure 11:
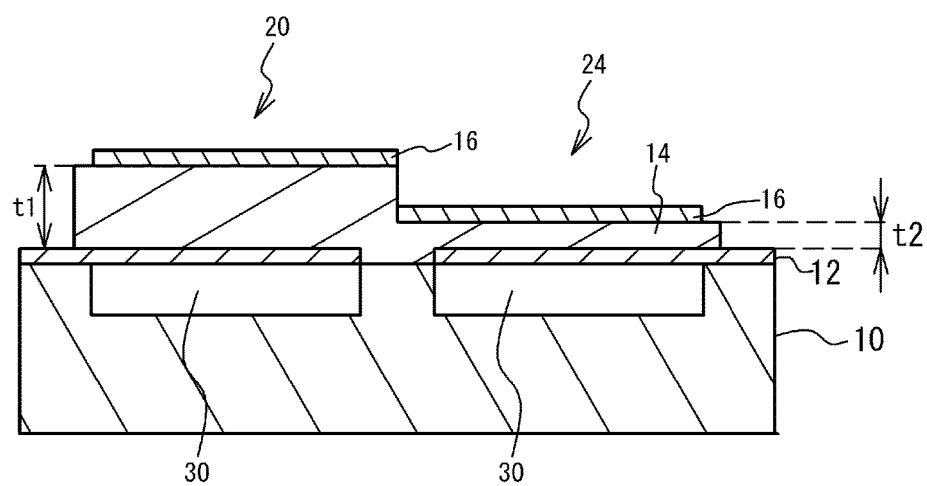
FIG. 11 is a cross-sectional view illustrating a case where the piezoelectric thin film resonator and the acoustic wave resonator shown in FIG. 8A are formed on the same substrate.

FIG. 11 is a cross-sectional view illustrating a case in which the piezoelectric thin film resonator 20 and the acoustic wave resonator 24 are formed on the same substrate. As illustrated in FIG. 11, the lower electrode 12, the piezoelectric film 14, and the upper electrode 16 are formed on a substrate 10 across air gaps 30. In the piezoelectric thin film resonator 20, the film thickness t1 of the piezoelectric film 14 is set to 957 nm, while in the acoustic wave resonator 24, the film thickness t2 of the piezoelectric film 14 is set to 224 nm. As described above, the film thickness of each film of the multilayered film other than the piezoelectric film 14 is made to be the same and the film thickness of the piezoelectric film 14 is made to be different between the piezoelectric thin film resonator 20 and the acoustic wave resonator 24. This configuration allows the piezoelectric thin film resonator 20 and the acoustic wave resonator 24 to be formed on the same substrate. The substrate 10 can be a sapphire substrate, a spinel substrate, an alumina substrate, or a silicon substrate. The air gap 30 may penetrate through the substrate 10. The air gap 30 may be an acoustic mirror reflecting the acoustic wave.

As described in the second embodiment, the acoustic wave resonator 24 can be used as a resonant circuit. This configuration allows the second harmonic to be reduced without dividing the piezoelectric thin film resonator 20.

In addition, as illustrated in FIG. 10C, the film thickness t2 of the piezoelectric film 14 of the acoustic wave resonator 24 is made to be less than ½ of the film thickness t1 of the piezoelectric film 14 of the piezoelectric thin film resonator 20. This configuration allows the resonant frequency of the acoustic wave resonator 24 to be approximately twice the resonant frequency of the piezoelectric thin film resonator 20.

As illustrated in FIG. 11, the piezoelectric thin film resonator 20 and the acoustic wave resonator 24 are located on the same substrate 10. The materials and the film thicknesses of the lower electrode 12 and the upper electrode 16 of the acoustic wave resonator 24 are made to be the same as the materials and the film thicknesses of the lower electrode 12 and the upper electrode 16 of the piezoelectric thin film resonator 20, respectively. The film thicknesses of the piezoelectric films 14 are made to be different. Accordingly, the piezoelectric thin film resonator 20 and the acoustic wave resonator 24 can be easily formed on the same substrate 10.

First Variation of Second Embodiment

Figure 12:
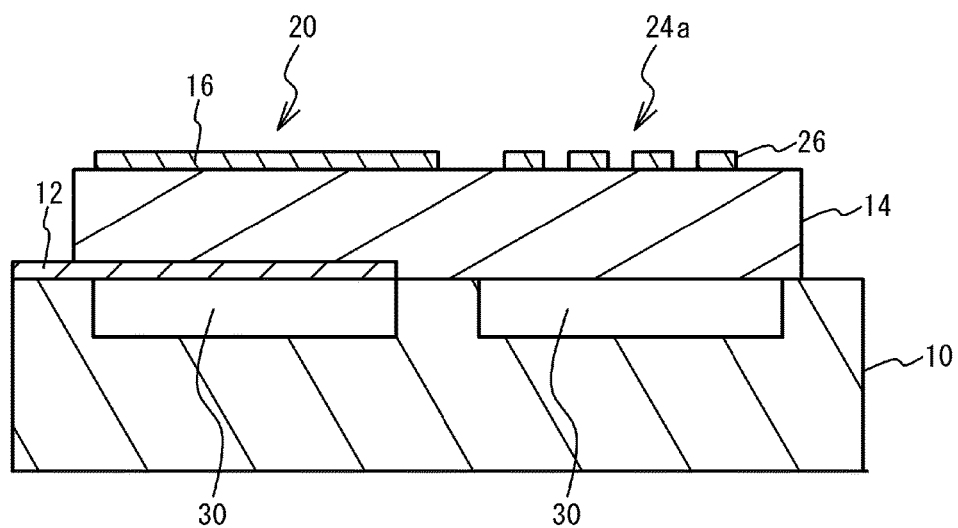
FIG. 12 is a cross-sectional view of an acoustic wave device in accordance with a first variation of the second embodiment.

FIG. 12 is a cross-sectional view of an acoustic wave device in accordance with a first variation of the second embodiment. As illustrated in FIG. 12, a Lamb wave resonator is used as an acoustic wave resonator 24a. In the acoustic wave resonator 24a, the piezoelectric film 14 and a comb-shaped electrode 26 are located above the air gap 30. The use of the Lamb wave resonator as the acoustic wave resonator 24a allows the piezoelectric film 14 to be shared by the piezoelectric thin film resonator 20 and the acoustic wave resonator 24. Accordingly, the piezoelectric thin film resonator 20 and the acoustic wave resonator 24 can be easily formed on the same substrate 10.

In the second embodiment and the first variation thereof, as illustrated in FIG. 11 and FIG. 12, the acoustic wave resonator 24 or 24a is another piezoelectric thin film resonator or a Lamb wave resonator. The piezoelectric thin film resonator 20 and the acoustic wave resonator 24 or 24a are formed on the same substrate 10. The piezoelectric film 14 of the piezoelectric thin film resonator 20 and the piezoelectric film 14 of the acoustic wave resonator 24 or 24a share the same piezoelectric film 14. Therefore, the piezoelectric thin film resonator 20 and the acoustic wave resonator 24 or 24a can be easily formed on the same substrate 10.

The piezoelectric thin film resonator and the Lamb wave resonator have been described as examples of the acoustic wave resonator 24, but the acoustic wave resonator 24 may be a surface acoustic wave resonator.

Third Comparative Example: Ladder-Type Filter

The second harmonic of a ladder-type filter was simulated. FIG. 13A is a circuit diagram of a filter in accordance with a third comparative example, and FIG. 13B presents conditions of each resonator used for the simulation of the third comparative example. As illustrated in FIG. 13A, series resonators S1 through S4 are connected in series between an input terminal Tin and an output terminal Tout. Parallel resonators P1 through P3 are connected in parallel between the input terminal Tin and the output terminal Tout.

Simulated was the magnitude of the second harmonic output from the output terminal Tout when a fundamental wave was input to the input terminal Tin. The conditions of the simulation are as follows.
Passband: 2500 MHz to 2570 MHz (corresponds to band 7)
Frequency band twice the passband: 5000 MHz to 5140 MHz
Fundamental wave input to the input terminal: 28 dBm
Type of the resonator: Piezoelectric thin film resonator
The capacitance value and the resonant frequency of each resonator were set to those presented in FIG. 13B.

Figure 14A:
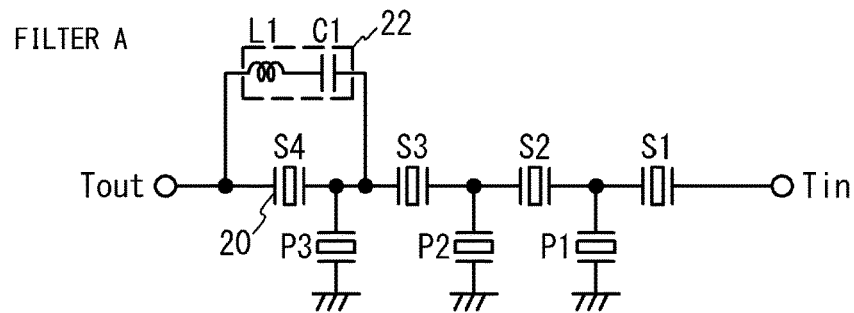
FIG. 14A through FIG. 14C are circuit diagrams of filters A through C of a third embodiment, respectively.
Figure 14B:
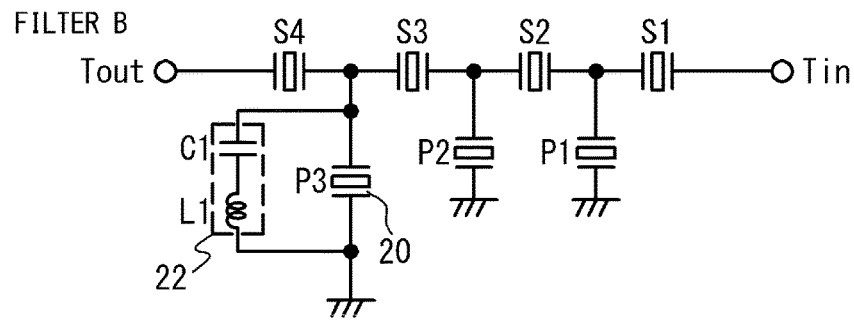
Figure 14C:
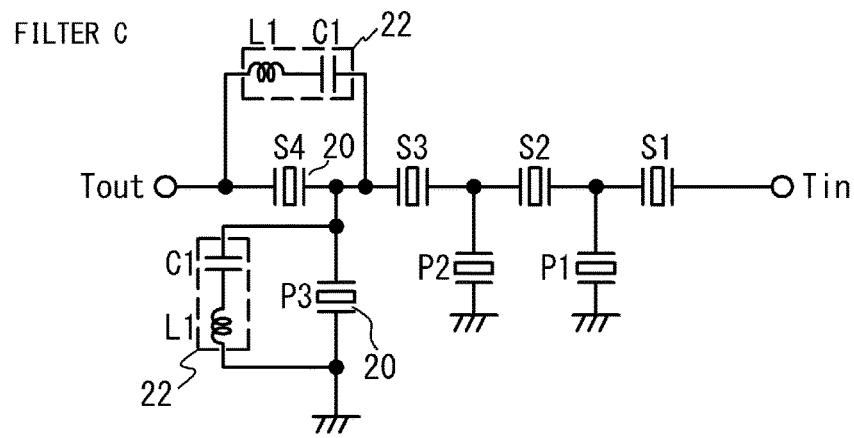

FIG. 13C is a graph of the magnitude of the second harmonic versus frequency in the third comparative example. As illustrated in FIG. 13C, the magnitude of the second harmonic has a concave shape in which the second harmonic at the low frequency end and at the high frequency end of the band is large and the second harmonic at the center is small. The magnitudes of the second harmonic at the low frequency end and at the high frequency end are respectively −23 dBm and −29 dBm. Across the entire band, the second harmonic is large. Third Embodiment FIG. 14A through FIG. 14C are circuit diagrams of filters A through C of a third embodiment, respectively. As illustrated in FIG. 14A, in the filter A, the series resonator S4 is the piezoelectric thin film resonator 20 with which the resonant circuit 22 is connected in parallel. Other structures are the same as those of the third comparative example, and the description thereof is thus omitted. As illustrated in FIG. 14B, in the filter B, the parallel resonator P3 is the piezoelectric thin film resonator 20 with which the resonant circuit 22 is connected in parallel. Other structures are the same as those of the third comparative example, and the description thereof is thus omitted. As illustrated in FIG. 14C, in the filter C, each of the series resonator S4 and the parallel resonator P3 is the piezoelectric thin film resonator 20 with which the resonant circuit 22 is connected in parallel. Other structures are the same as those of the third comparative example, and the description thereof is thus omitted.

Most of the second harmonic output from the output terminal Tout is the second harmonic emitted from the series resonator S4 located closest to the output terminal Tout among the series resonators S1 through S4 and/or the second harmonic emitted from the parallel resonator P3 located closest to the output terminal Tout among the parallel resonators P1 through P3. This is because the second harmonic emitted from the resonator located closer to the input terminal Tin attenuates as passing the resonators closer to the output terminal Tout. Thus, in the filters A through C, the series resonator S4 and/or the parallel resonator P3 located closest to the output terminal Tout includes the resonant circuit 22.

In the filters A through C, simulated was the magnitude of the second harmonic output from the output terminal Tout when a fundamental wave was input to the input terminal Tin. The simulation conditions are the same as those of FIG. 6 of the first embodiment and the third comparative example.

Figure 15A:
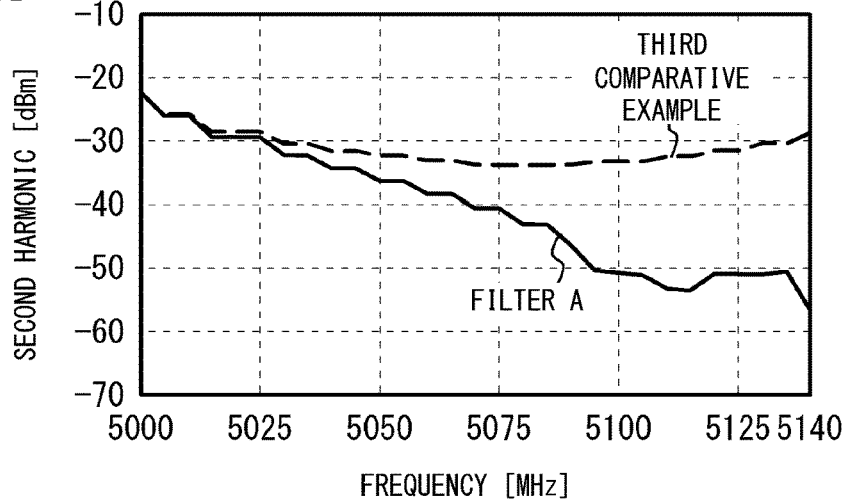
FIG. 15A through FIG. 15C are graphs of a second harmonic versus frequency of the filters shown in FIG. 14A through FIG. 14C.
Figure 15B:
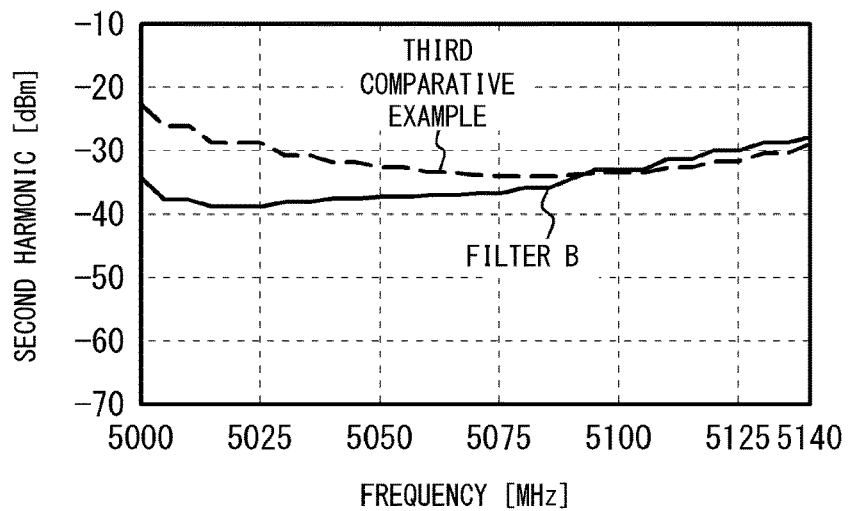
Figure 15C:
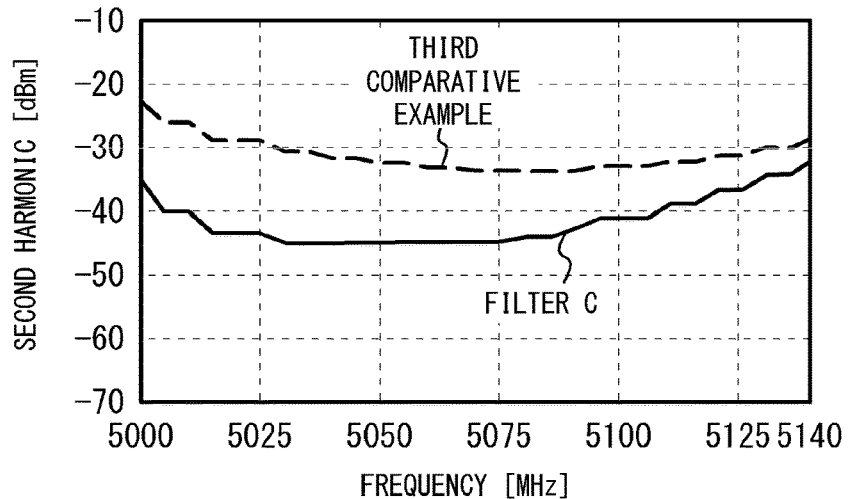

FIG. 15A through FIG. 15C are graphs of a second harmonic versus frequency in the filters A through C, respectively. As illustrated in FIG. 15A through FIG. 15C, the second harmonic in the band in the filters A through C is less than that in the third comparative example. In the filter A, the second harmonic at high frequencies is reduced. In the filter B, the second harmonic at low frequencies is reduced. In the filter C, the second harmonic is reduced across the entire band.

Figure 16A:
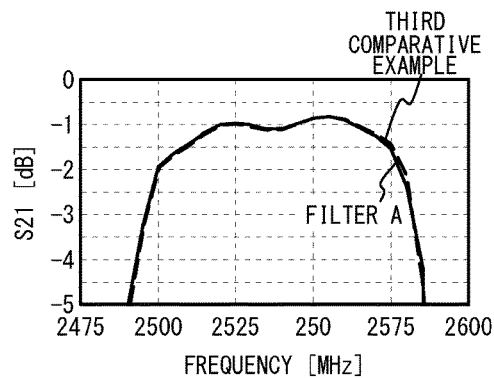
FIG. 16A through FIG. 16C illustrate pass characteristics of the filters A through C, respectively.
Figure 16B:
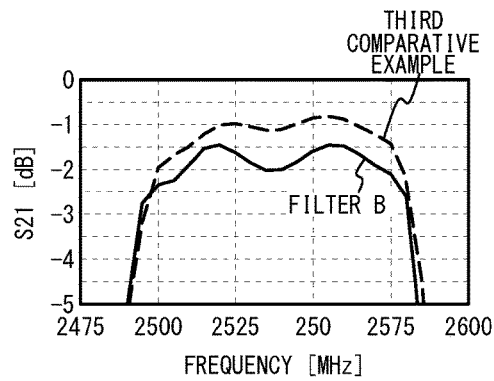
Figure 16C:
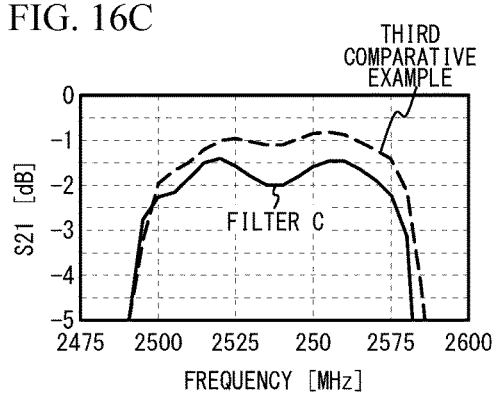
Figure 16D:
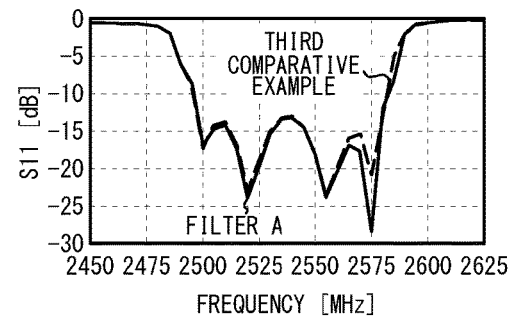
FIG. 16D through FIG. 16F illustrate reflection characteristics of the filters shown in FIG. 14A through FIG. 14C, respectively.
Figure 16E:
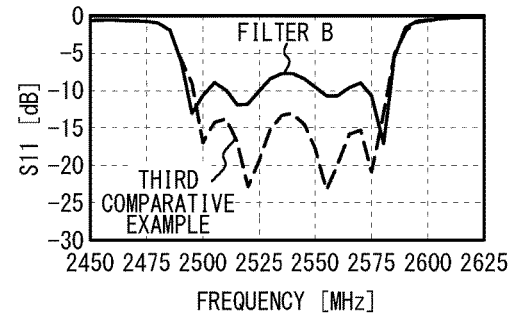
Figure 16F:
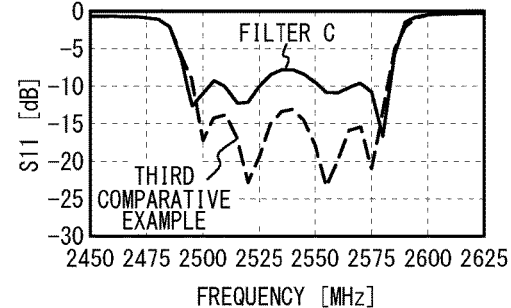

FIG. 16A through FIG. 16C respectively illustrate the pass characteristics of the filters A through C, and FIG. 16D through FIG. 16F respectively illustrate the reflection characteristics of the filters A through C. As illustrated in FIG. 16A through FIG. 16F, the pass characteristic and the reflection characteristic of the filter A are approximately equal to those of the third comparative example. The pass characteristics and the reflection characteristics of the filters B and C deteriorate compared to those of the third comparative example. The addition of the resonant circuit 22 changes impedance. Accordingly, it is considered that the pass characteristics and the reflection characteristics in the filters B and C changed from those of the comparative example.

In the third embodiment, at least one of one or more series resonators S1 through S4 and one or more parallel resonators P1 through P3 is the piezoelectric thin film resonator 20 with which the resonant circuit 22 is connected in parallel. This configuration can reduce the second harmonic without dividing the resonator (i.e., without increasing the chip size).

In addition, at least one of the series resonator S4 and the parallel resonator P3 that affect the second harmonic output from the output terminal Tout the most is the piezoelectric thin film resonator 20 with which the resonant circuit 22 is connected in parallel. This configuration can further reduce the second harmonic.

First Variation of Third Embodiment

Figure 17A:
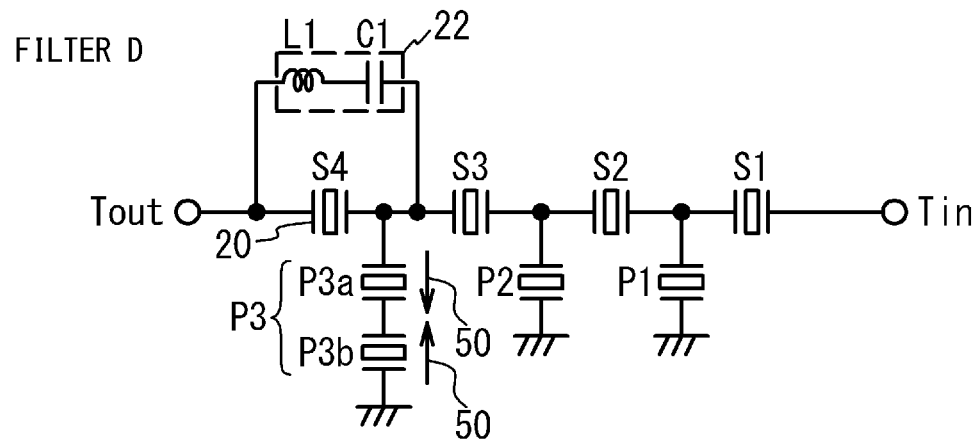
FIG. 17A and FIG. 17B are circuit diagrams of filters D and E of a first variation of the third embodiment, respectively.
Figure 17B:
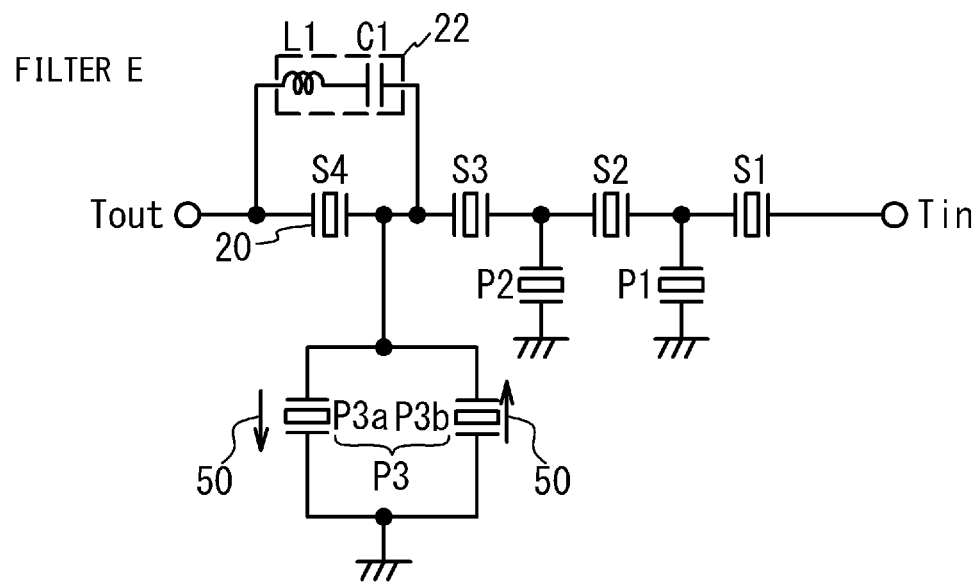

FIG. 17A and FIG. 17B are circuit diagrams of filters D and E of a first variation of the third embodiment, respectively. As illustrated in FIG. 17A, the filter D uses the piezoelectric thin film resonator 20 with which the resonant circuit 22 is connected in parallel for the series resonator S4. The parallel resonator P3 is divided into resonators P3a and P3b in reverse series. The lower electrode or the upper electrode in the c-axis direction 50 of the resonator P3a has an electric potential equal to that of the lower electrode or the upper electrode in the c-axis direction 50 of the resonator P3b. That is, the c-axis direction 50 of the resonator P3a viewed from a ground (or the node between the series resonators S3 and S4) is opposite to the c-axis direction 50 of the resonator P3b viewed from the ground. Other structures are the same as those of the third comparative example, and the description thereof is thus omitted.

As illustrated in FIG. 17B, in the filter E, the parallel resonator P3 is divided into the resonators P3a and P3b in reverse parallel. The lower electrode or the upper electrode in the opposite direction to the c-axis direction 50 of the resonator P3a has an electric potential equal to that of the lower electrode or the upper electrode in the opposite direction to the c-axis direction 50 of the resonator P3b. That is, the c-axis direction 50 of the resonator P3a viewed from a ground (or the node between the series resonators S3 and S4) is opposite to the c-axis direction 50 of the resonator P3b viewed from the ground. Other structures are the same as those of the filter D, and thus the description thereof is thus omitted.

Figure 18A:
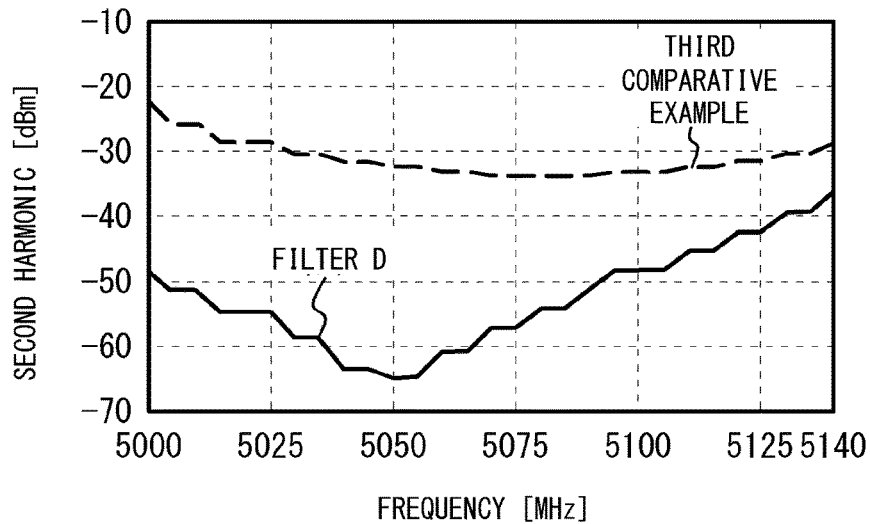
FIG. 18A is a graph of a second harmonic versus frequency of the filter shown in FIG. 17A, and FIG. 18B and FIG. 18C illustrate pass characteristics and reflection characteristics of the filter shown in FIG. 17A, respectively.
Figure 18B:
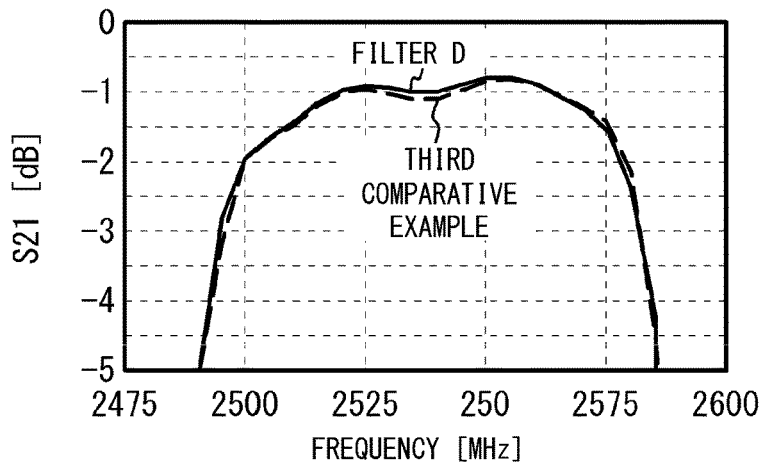
Figure 18C:
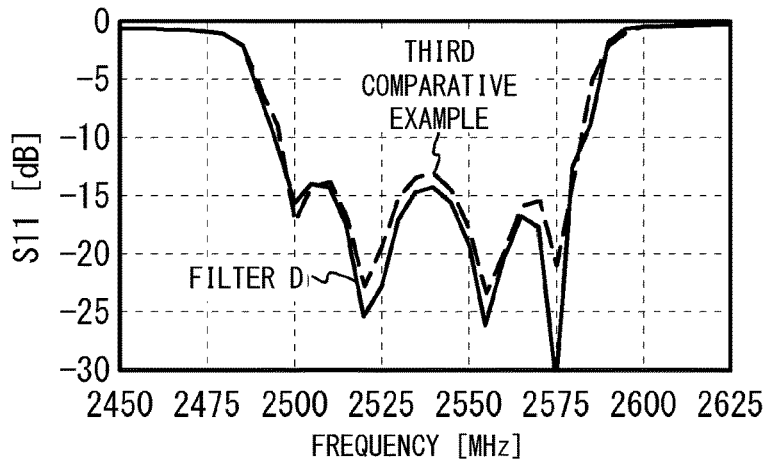

FIG. 18A is a graph of a second harmonic versus frequency of the filter D, and FIG. 18B and FIG. 18C illustrate a pass characteristic and a reflection characteristic, respectively. As illustrated in FIG. 18A, the second harmonic of the filter D is less than that of the third comparative example by 10 dBm or more across the entire band. As illustrated in FIG. 18B and FIG. 18C, the pass characteristic and the reflection characteristic of the filter D are approximately equal to those of the third comparative example.

As illustrated in FIG. 16A through FIG. 16F, when the resonant circuit 22 is provided, the pass characteristic and the reflection characteristic may deteriorate. In the variation of the third embodiment, the series resonator S4 is the piezoelectric thin film resonator 20 with which the resonant circuit 22 is connected in parallel. The parallel resonator P3 is divided into the resonator P3a (a first resonator) and the resonator P3b (a second resonator) so that the second harmonic is canceled. When the resonator is divided, the impedance remains unchanged. Thus, the deterioration of the pass characteristic and the reflection characteristic occurring in the filters B and C can be reduced. In addition, compared to the filters A and B, the second harmonic can be reduced. Furthermore, compared to a filter in which both the series resonator S4 and the parallel resonator P3 are divided, the chip size can be decreased.

In the filters B and C, the pass characteristic and the reflection characteristic are deteriorated by providing the resonant circuit 22 in the parallel resonator P3. However, even when the resonant circuit 22 is located in the series resonator S4, the pass characteristic and the reflection characteristic may deteriorate. Thus, it is sufficient if one of the series resonator S4 and the parallel resonator P3 is the piezoelectric thin film resonator 20 with which the resonant circuit 22 is connected in parallel, and the other of the series resonator S4 and the parallel resonator P3 is divided (i.e., divided in reverse series or divided in reverse parallel) so that the second harmonic is cancelled.

Fourth Embodiment

Figure 19:
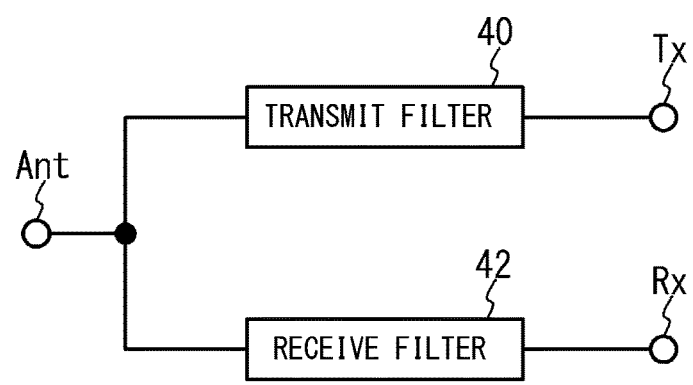
FIG. 19 is a circuit diagram of a duplexer in accordance with a fourth embodiment

FIG. 19 is a circuit diagram of a duplexer in accordance with a fourth embodiment. As illustrated in FIG. 19, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx Ant as reception signals among signals input from the common terminal Ant, and suppresses signals with other frequencies. At least one of the transmit filter 40 and the receive filter 42 may be the filter according to any one of the third embodiment and the variation thereof.

A duplexer has been described as an example of a multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric thin film resonator that is connected between a first node and a second node; and
a resonant circuit that is connected in parallel with the piezoelectric thin film resonator between the first node and the second node, and has a resonant frequency f0 that is equal to or more than 2×fa×0.92 where fa represents an antiresonant frequency of the piezoelectric thin film resonator.

2. The acoustic wave device according to claim 1, wherein the resonant frequency f0 is equal to or more than 2×fa×0.95 and is equal to or less than 2×fa×1.08.

3. The acoustic wave device according to claim 1, wherein the resonant circuit includes a capacitor and an inductor connected in series between the first node and the second node.

4. The acoustic wave device according to claim 1, wherein the resonant circuit includes an acoustic wave resonator connected in series between the first node and the second node.

5. The acoustic wave device according to claim 4, wherein the acoustic wave resonator is another piezoelectric thin film resonator or a Lamb wave resonator,
the piezoelectric thin film resonator and the acoustic wave resonator are formed on a same substrate, and
the piezoelectric thin film resonator and the acoustic wave resonator share a single piezoelectric film.

6. The acoustic wave device according to claim 1, further comprising:
a filter that includes one or more series resonators connected in series between an input terminal and an output terminal and one or more parallel resonators connected in parallel between the input terminal and the output terminal, wherein
at least one of the one or more series resonators and the one or more parallel resonators is the piezoelectric thin film resonator with which the resonant circuit is connected in parallel.

7. The acoustic wave device according to claim 6, wherein
at least one of a series resonator located closest to the output terminal among the one or more series resonators and a parallel resonator located closest to the output terminal among the one or more parallel resonators is the piezoelectric thin film resonator with which the resonant circuit is connected in parallel.

8. The acoustic wave device according to claim 7, wherein
one of the series resonator located closest to the output terminal among the one or more series resonators and the parallel resonator located closest to the output terminal among the one or more parallel resonators is the piezoelectric thin film resonator with which the resonant circuit is connected in parallel, and
another of the series resonator located closest to the output terminal and the parallel resonator located closest to the output terminal is divided into a first resonator and a second resonator so that a second harmonic is canceled.

9. The acoustic wave device according to claim 1, further comprising:
   a filter that includes the piezoelectric thin film resonator with which the resonant circuit is connected in parallel.

10. The acoustic wave device according to claim 9, further comprising
   a multiplexer including the filter.

* * * * *